United States Patent [19]

Hart et al.

[11] 4,322,632

[45] Mar. 30, 1982

[54] REMOTE LOAD SELECTOR

[75] Inventors: Edward F. Hart, Arlington; Deane D. Fletcher, II, Plano, both of Tex.

[73] Assignee: Teccor Electronics, Inc., Euless, Tex.

[21] Appl. No.: 133,350

[22] Filed: Mar. 24, 1980

[51] Int. Cl.³ .............................................. H02J 4/00
[52] U.S. Cl. .................................. 307/41; 307/252 B; 315/322; 340/310 A
[58] Field of Search .................... 307/38, 41, 115, 29, 307/242, 252 B, 252 N, 252 Q; 315/322; 318/102; 340/310 A; 361/191

[56] References Cited

U.S. PATENT DOCUMENTS 4,075,501  2/1978  Kondo .................................. 307/41

Primary Examiner—L. T. Hix
Assistant Examiner—S. D. Schreyer
Attorney, Agent, or Firm—Hubbard, Thurman, Turner, Tucker & Glaser

[57] ABSTRACT

Circuitry for applying electrical power to one or more load devices under control of a remotely located manually operable switch coupled to the circuitry by a single power transmission line. The circuitry responds to toggling of the remotely located switch to, for example, in a first state apply power to a first load, in a second state apply power to the second load, and in a third state apply power to both the first and second loads.

5 Claims, 3 Drawing Figures 4,322,632

REMOTE LOAD SELECTOR

BACKGROUND OF THE INVENTION

The present invention relates to remotely controlled power switching devices, and more particularly, to circuitry for selectively applying power to one or more of a group of load devices by toggling a remotely located manually operable switch.

The energy shortages which have occurred in recent years and corresponding increases in cost of energy, such as the electrical power supplied to residential structures, are well known. In response to the increased costs, many people have set their air-conditioning thermostats at higher temperatures to reduce energy consumption. Many people have also turned to the ceiling paddle-type fans for providing greater air circulation which greatly improves the comfort at the higher temperatures.

A problem which has increased the cost of installing these ceiling fans, especially in an existing structure, has been the additional wiring and control switches which must be installed. One way of avoiding the extra wiring costs is to remove a ceiling light fixture and install the fan in its place so that the original switch and wiring may be used for the fan. This approach has several deficiencies. The first is the obvious loss of the light fixture. Many fans are provided with a built-in light fixture but if the fan and light fixture are to be separately controlled, the additional line is still needed. Also, many of the ceiling fans have two or more speeds of operation so that a multiple position switch and extra cabling is normally required to allow selection of fan speed from the wall mounted switch. Thus, it can be seen that it would be desirable to provide an arrangement with which a ceiling fan may be installed in place of a single light fixture and multiple loads such as both the fan motor and a built-in light fixture could be selectively controlled from an originally installed manually operable switch connected to the fan by a single two-conductor transmission cable.

SUMMARY OF THE INVENTION

Accordingly, an object to the present invention is to provide circuitry for selectively applying electrical power to one or more of a group of load devices under control of a remotely located manually operable switch.

Another object of the present invention is to provide a remote load selector device which allows the selective application of electrical power to multiple loads, such as a ceiling fan and its built-in light fixture, when such loads are installed in a pre-existing outlet to which power is supplied under control of a single manually operable switch.

The selective application of electrical power to one or more of a plurality of load devices is achieved by providing circuitry, including an electronically controllable power switch for each load device and control circuitry having an input adapted for coupling to a remotely located manually operable switch by a single two wire power transmission cable and having outputs for controlling the states of the power switches in response to actuation or toggling of the manually operable switch.

BRIEF DESCRIPTION OF THE DRAWINGS

The present invention may be better understood by reading the following detailed description of the preferred embodiments with reference to the accompanying drawings wherein.

DESCRIPTION OF THE PREFERRED EMBODIMENTS

Figure 1:
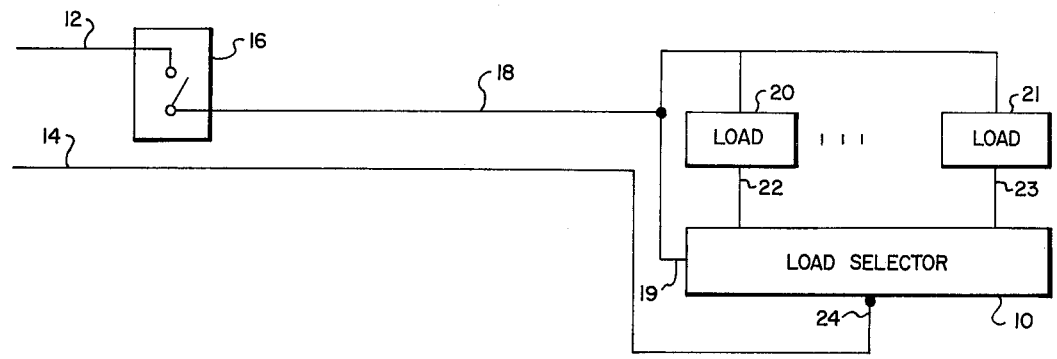
FIG. 1 is a block diagram illustrating the coupling of a remote load selector according to the present invention to a manually operable switch and a plurality of load devices.

With reference now to FIG. 1, the installation of a remote load selector, indicated by the block 10, in a typical residential lighting circuit is illustrated. A typical two wire 110 volt power transmission line is indicated by the hot conductor 12 and the common conductor 14. In a typical lighting circuit, the hot conductor 12 is connected to one terminal of a single pole, single throw wall switch 16. The other terminal of switch 16 is typically connected to a conductor 18 which together with an extension of the common line 14 forms a power transmission line which runs from the location of wall switch 16 to the location of a ceiling fixture such as a light fixture. In the present invention, a plurality of load devices 20, 21 is installed in place of a single load device such as a light fixture. The conductor 18 is connected to one terminal of each of the load devices 20, 21. In addition, the conductor 18 is connected to an input terminal 19 of the load selector device 10. In a standard wiring arrangement, the second terminals 22, 23 of load devices 20 would each be connected to the line 14. In such an arrangement, all devices 20, 21 would be turned on and off simultaneously under control of switch 16. According to the present invention, the second terminals 22, 23 of load devices 20 are connected to power terminals of the load selector 10 and the common line 14 is connected to another power terminal 24 of selector 10. The load selector 10 includes electronically controllable power switches for selectively completing circuits between the second terminals 22, 23 of the load devices 20 and the common line 14. The details of a preferred load selector device 10 will be described with respect to FIG. 3.

Figure 2:
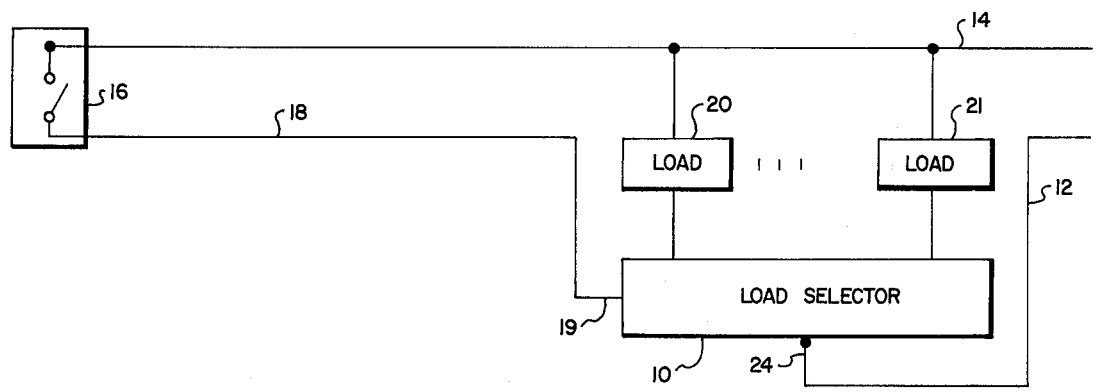
FIG. 2 is a block diagram showing the installation of the remote load selector according to the present invention in a second typical house wiring arrangement.

With reference now to FIG. 2, the installation of the load selector 10 in a second commonly encountered house lighting circuit is illustrated. In FIG. 2, the incoming power line comprising the hot lead 12 and common lead 14 are brought in to the location of the ceiling light fixture rather than the location of the wall switch 16. In such an arrangement, the common lead 14 is typically connected to one terminal of the load device and the second terminal of the load device or devices is usually connected to one conductor of a two conductor line connected to the wall switch 16. The hot line 12 is then typically connected at the location of the ceiling fixture directly to a second lead, such as lead 18 of the two wire line running to the switch 16. The load selector 10 of the present invention may be installed in such an arrangement as shown in FIG. 2. In this arrangement, the common lead 14 is connected to the first terminals of each of the load devices 20, 21 and also continues to one terminal of the switch 16. The hot line 12 is then connected to the terminal 24 of load selector 10 and the second line 18 from the switch 16 is connected to the remaining terminal 19 of the load selector 10. As will be seen below, the identical load selector 10 may be used in either of these commonly encountered wiring arrangements.

Figure 3:
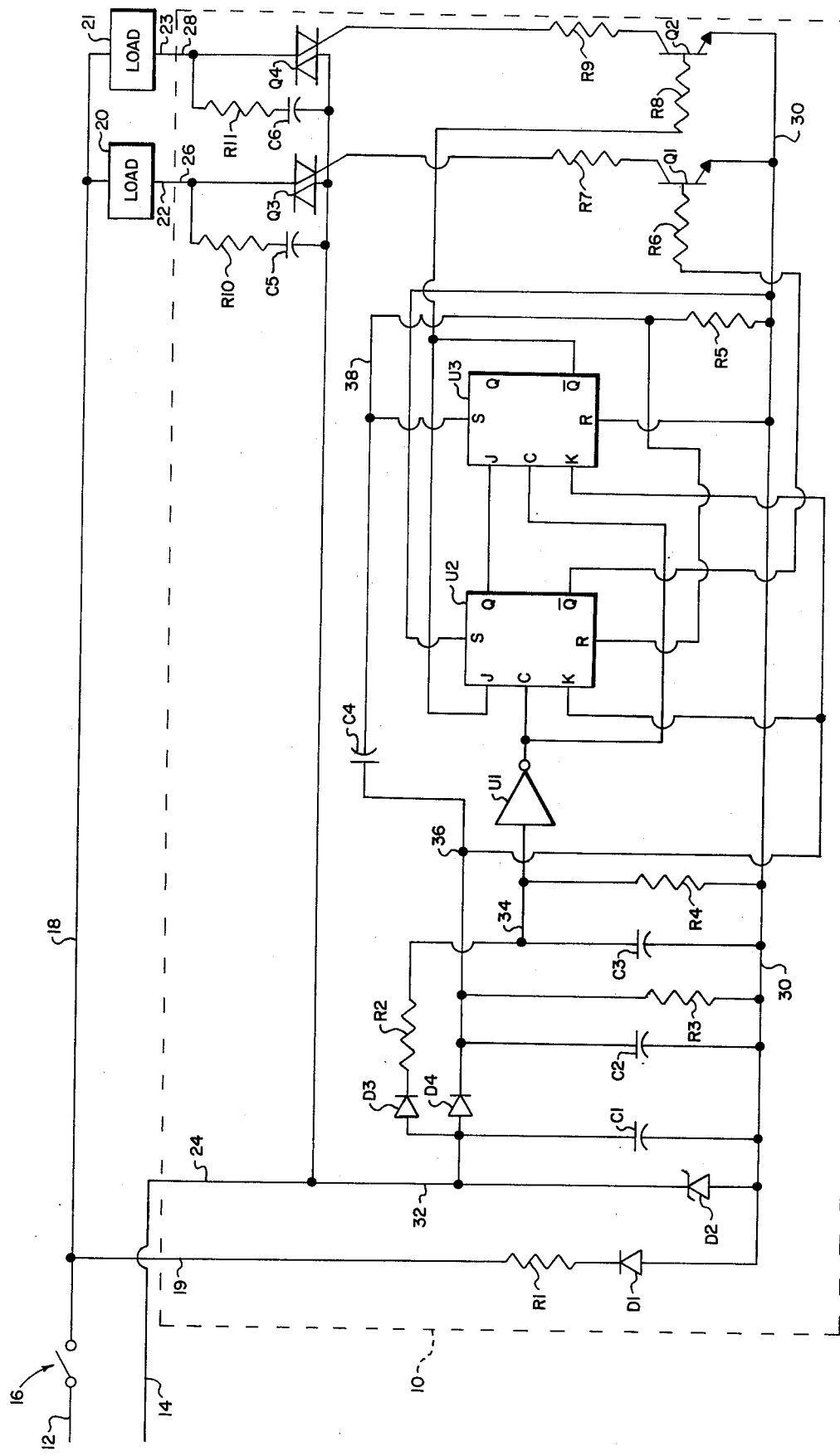
FIG. 3 is a detailed schematic diagram of a preferred embodiment of the present invention adapted for selectively controlling application of power to two load devices.

With reference now to FIG. 3, a detailed schematic diagram of a remote load selector is illustrated within the dotted line box 10. The remaining portions of the circuitry correspond to the FIG. 1 installation and carry corresponding designation numbers. The remote load selector includes power terminals 26 and 28 connected to the second terminals 22, 23 of load devices 20, 21. Electronically controllable power switch devices Q3 and Q4 are connected between the power terminals 26 and 28 respectively and the terminal 24 of selector 10. As indicated by the schematic diagram, the devices Q3 and Q4 are bidirectional thyristors. In the preferred embodiment, devices Q3 and Q4 were commercially available devices sold by Teccor Electronics Inc. of Euless, Texas under the part number Q4010L4. Other similar devices could of course be substituted. Each of the devices Q3 and Q4 is bypassed by R-C circuits comprising devices R10 and C5 and R11 and C6 respectively. In this embodiment, devices R10 and R11 have values of 330 ohms and devices C5 and C6 have values of 0.047 microfarads with these values selected to prevent false triggering of devices Q3 and Q4. Gate inputs of each of the devices Q3 and Q4 are connected through resistors R7 and R9 respectively to collectors of transistors Q1 and Q2. Resistors R7 and R9 have values of 300 ohms selected to provide gate currents in the range of twenty-five to thirty milliamperes. The emitters of transistors Q1 and Q2 are connected to a reference voltage terminal 30. The bases of transistors Q1 and Q2 are connected to resistors R6 and R8, which in this preferred embodiment each have a value of 20 kilohms. In the preferred embodiment, transistors Q1 and Q2 were of the commonly available 2N2222 type.

The reference voltage of node 30 is provided by circuitry on the left side of FIG. 3. The series combination of a current limiting resistor R1 and a diode D1 is connected between the power line 18 and node 30. In the preferred embodiment, resistor R1 has a value of 1 kilohm and diode D1 is a commonly available 1N4005 type. Diode D1 provides a half-wave rectified voltage signal on node 30. A regulating diode D2 is connected between the node 30 and a second node 32 which is connected to the input 24 of the load selector 10. In the preferred embodiment, diode D2 has a breakdown voltage of thirteen volts. A capacitor C1 is provided in parallel with diode D2 to provide smoothing of the half-wave rectified signal. Capacitor C1 in the preferred embodiment has a value of 220 microfarads. Diode D2, together with capacitor C1, therefore provides a somewhat regulated DC voltage of about thirteen volts between nodes 30 and 32. It will be noted that this is the voltage which appears across the circuits comprising the gates of switching devices Q3 and Q4 and the transistors Q1 and Q2 respectively.

A first transition detecting circuit includes a diode D3, resistor R2, and capacitor C3 connected in series between nodes 32 and 30. In the preferred embodiment, diode D3 is a commonly available 1N4148 type, resistor R2 has a value of 1 kilohm, and capacitor C3 has a value of 22 microfarads. A resistor R4 having, in the preferred embodiment, a value of 10 kilohms is provided in parallel with capacitor C3 to discharge the capacitor whenever the supply of power is discontinued. A Schmitt trigger circuit U1 has an input connected to the node 34, which is common to resistors R2 and R4 and capacitor C3. In the preferred embodiment, Schmitt trigger U1 was a Motorola Semiconductor type MC14584B known more commonly as a type 4584 Schmitt trigger. Other similar Schmitt trigger devices or one shot type devices could be substituted. The output of Schmitt trigger U1 is coupled to the clock inputs of two flip-flops U2 and U3 described in more detail below.

A somewhat regulated voltage is provided on a node 36. A diode D4 of the same type as diode D3 is connected between node 32 and node 36. A capacitor C2, preferably identical to capacitor C1, is connected between node 36 and node 30. A resistor R3 is connected in parallel with capacitor C2 to bleed off the charge on capacitor C2 when the main power supply is removed. In the preferred embodiment, resistor R3 has a value of 10 kilohms. The voltage on node 36 is a fairly well regulated voltage near 12 volts and is used to supply power to the logic devices U1, U2, and U3. A second transition detector comprising the series combination of a capacitor C4 and a resistor R5 is connected between nodes 36 and 30. In the preferred embodiment, capacitor C4 has a value of 22 microfarads and resistor R5 has a value of 10 kilohms. The circuit comprising capacitor C4 and resistor R5 acts as a differentiator to provide an impulse on the node 38 common to the two elements in response to a positive transition on node 36. Node 38 is connected to the reset input of flip-flop U2 and to the set input of flip-flop U3.

The flip-flops U2 and U3 are both preferably part of a single integrated circuit sold by the Motorola Semiconductor Corporation under part number MC14027B and generically known as a type 4027. Other similar devices such as an RCA type CD4027AE may also be employed. As illustrated in the drawing, the $\bar{Q}$ outputs of flip-flops U2 and U3 are connected to the resistors R6 and R8 respectively and thereby to the bases of transistors Q1 and Q2 respectively. The $\bar{Q}$ output of flip-flop U3 is also connected to the J input of flip-flop U2. The $\bar{Q}$ output of flip-flop U2 is connected to the J input of flip-flop U3. The K input of both flip-flops U2 and U3 are connected to the node 36. The set input of flip-flop U2 and the reset input of flip-flop U3 are connected to the reference node 30 to prevent activation of these functions.

With reference now to FIG. 3, the operation of the remote load selector of the present invention will be described. When it is desired to supply power to one of the loads 20, 21, the switch 16 is manually closed. Upon this occurrence, a positive voltage appears on nodes 32, 34, and 36 relative to the reference node 30. This step increase on node 36 is differentiated by capacitor C4 to provide an impulse on node 38 which resets flip-flop U2 and sets flip-flop U3. As a result, the Q output of flip-flop U2 is at a high level and turns on transistor Q1, which draws current from the gate of thyristor Q3 which is thereby actuated and supplies power to load 20. Flip-flop U3, on the other hand, provides a low level $\bar{Q}$ output and, as a result, transistor Q2 draws no current from switching device Q4 and its load 21 remains without power. Upon the initial closing of switch 16, a positive voltage step also occurred on node 34 which caused a negative step on the output of Schmitt trigger U1 which has no effect on the clock inputs of flip-flops U2 and U3 which respond to positive going transitions only.

The user may desire to supply power to the second load 21 and may do this by momentarily opening switch 16 and reclosing it, or in other words, toggling the wall switch. When wall switch 16 is opened, the voltage on node 32 relative to node 30 drops quickly to zero as a result of conduction through the gate circuit of one or both of switching devices Q3 and Q4. Shortly thereafter, the voltage on node 34 also drops to zero as a result of the resistor R4 bleeding the charge from capacitor C3. The time constants are selected so that momentary line drop-outs will not cause a significant drop in voltage on node 34. In addition, the time constant of the R3-C2 combination is selected so that the voltage on node 36 remains high relative to node 30 for a much longer time than the voltage on node 34. In response to the drop in voltage on node 34, the Schmitt trigger U1 provides a positive going transition on its output which clocks both flip-flops U2 and U3. At the time of receiving this clock signal, the J inputs of both flip-flops are low and the K inputs are both high. As a result, the $\overline{Q}$ outputs of both flip-flops are in a high state after the first clock pulse. Therefore, in this second state, the flip-flop outputs drive both transistors Q1 and Q2 into conduction to, in turn, activate both the switching devices Q3 and Q4 and supply power to both loads 20 and 21, when the wall switch 16 is again closed. Thus, the change of state of the storage or memory devices U2 and U3 occurs very shortly after switch 16 is opened, and if switch 16 is reclosed before the voltage level on node 36 drops sufficiently to deactivate the logic circuitry, both loads 20 and 21 will be turned on when the switch is reclosed.

If it is desired to supply power to load 21 only, the switch 16 is again toggled, that is opened momentarily and reclosed. Upon this second opening of switch 16, the Schmitt trigger U1 again generates a clock signal which is supplied to both flip-flops. Upon receipt of this second clock signal, it will be seen that both the J and K inputs of flip-flop U2 are high and this device acts as a toggle flip-flop under these input conditions. As a result, the $\overline{Q}$ output goes low deactivating transistor Q1 and device Q3. At the time of the second clock signal, the J input to flip-flop U3 was low and the K input was high so that the output state remains unchanged and transistor Q2 continues conducting and, in turn, activating switching device Q4. Thus, it is seen that upon toggling switch 16 a second time, power is supplied only to load 21.

If it is desired to return to the original state in which only load 20 is turned on, this can be achieved in two ways. In the first way, the switch 16 may simply be toggled a third time. In the third state in which only load 21 is activated, it will be seen that the J and K inputs of both flip-flops are high. As a result, both flip-flops toggle upon receipt of the third clock signal with the result that the device is returned to the first state in which the $\overline{Q}$ output of U2 is high and the $\overline{Q}$ output of U3 is low. The three step sequence can be repeated by continuous toggling of wall switch 16.

The device can also be returned to the original or first state by opening wall switch 16 for a time period which is sufficiently long to allow node 36 to discharge. When power is reapplied to the circuit, the capacitor C4 then causes the flip-flops U2 and U3 to reset in the state one condition in which only load 20 is turned on.

In an anticipated use, the load 20 may be a light fixture attached to a ceiling fan and load 21 may be the fan motor itself. The unit will operate as a simple light fixture under the typical condition in which a person enters a room and actuates switch 16 to provide lighting for the room. In the less frequent circumstance in which the person also wishes the fan to be activated, a switch 16 must be turned on and then toggled once, that is, turned off and quickly turned back on. By this operation, both the light and the fan will operate. If it is desired to have the fan operate without the light being on, the switch is simply toggled one more time and the fan will continue to run but the light will be turned off. Both the fan and the light may be turned off at any time simply by opening switch 16 in the normal manner.

It will be appreciated that the loads 20 and 21 could be separate windings in a two speed fan motor and a single toggle flip-flop clocked by Schmitt trigger U1 could be employed to alternately supply power to one or the other of the two windings. It will also be appreciated that more than two loads can be selectively powered according to the present invention by use of more flip-flops or shift register circuitry controlling a larger number of power switching devices.

It can also be seen that a circuit of FIG. 3 operates in exactly the same manner if incorporated in the circuit arrangement of FIG. 2. In that circumstance, the reference nodes 30, 32, 34 and 36 all float on the 110 volt power line signal, but this does not effect the operation as described.

While the present invention has been illustrated and described in terms of specific apparatus and methods of operation, it is apparent that numerous other modifications and changes can be made within the scope of the present invention as defined by the appended claims.

What is claimed is:

1. A remote load selector circuit for use with a system having a manually operable power switch coupled by an electrical transmission line to a plurality of remotely located loads, said selector circuit comprising:
   a plurality of gate controllable switching devices, each of said plurality of switching devices having power terminals adapted for connection in series with a selected one of said remotely located loads and having a gate input for controlling conduction between said power terminals;
   a plurality of bistable multivibrators, each of said multivibrators having at least one input for receiving a power transition signal and having at least one output coupled to the gate input of a selected one of said plurality of gate controllable switching devices; and,
   transition detecting means adapted for connection to said transmission line for providing a power transition signal in response to the application or removal of power to or from the transmission line portion connecting said manually operable power switch to said plurality of remotely located loads in response to the closing or opening of said manually operable power switch, and said transition detecting means being coupled to at least one input of each multivibrator for changing the output state of at least one of said plurality of bistable multivibrators in response to the power transition signal.

2. The remote load selector circuit as defined in claim 1, said bistable multivibrators being interconnected in a logical feedback configuration whereby the logical output state of one or more of said multivibrators is changed and said loads are actuated singly or in combination in response to toggling of said manually operable power switch.

3. The remote load selector as defined in claim 1, including
means coupled to each bistable multivibrator for maintaining the multivibrator output states which occur in response to a power transition signal provided in response to the temporary interruption of power to said transmission line portion and remote loads as said power switch is toggled.

4. A selector circuit for selectively supplying power to one or more load devices under control of a manually operable switch comprising:
a plurality of electronically controllable power switches, each power switch having power terminals adapted for connection in series with one of said loads and having a gate input terminal for controlling conduction between said power terminals;
digital storage means adapted for connection to said switch for receiving operating power when said switch is in closed circuit condition, said digital storage means having a plurality of logical outputs, at least one of said logical outputs being coupled to a gate input of each power switch;
transition detecting means adapted for connection to said switch for providing a power transition signal in response to the application or removal of power to or from said digital storage means and loads in response to the closing or opening of said manually operable power switch, and said transition detecting means being coupled to said digital storage means for changing the output state of at least one of said plurality of logical outputs in response to said power transition signal; and,
means coupled to said digital storage means for maintaining the logical output states of said digital storage means which occur in response to a power transition signal provided in response to the temporary interruption of power to said digital storage means and load devices as said manually operable switch is toggled.

5. A method for selectively supplying power to one or more load devices under control of a manually operable power switch comprising:
connecting the power terminals of a plurality of gate controllable power switches in series with each of said loads;
coupling at least one output of a digital memory device to a control gate of each of said power switches, to control the on/off condition of said switches by the logic states of said memory outputs;
generating a power transition signal in response to the application or removal of power to or from said digital memory device and load devices in response to the closing or opening of said manually operable power switch;
changing the output state of at least one of said plurality of logical outputs of said digital memory device in response to said power transition signal; and,
maintaining the logical output states of said digital storage means which occur in response to a power transition signal caused by the temporary interruption of power to said digital memory device and load devices as said power switch is toggled.

* * * * *